United States Patent
Zolfaghari et al.

(10) Patent No.: US 8,194,785 B2
(45) Date of Patent: *Jun. 5, 2012

(54) ARCHITECTURAL TECHNIQUES FOR ENVELOPE AND PHASE SIGNAL ALIGNMENT IN RF POLAR TRANSMITTERS USING POWER AMPLIFIER FEEDBACK

(75) Inventors: Alireza Zolfaghari, Irvine, CA (US); Henrik T. Jensen, Long Beach, CA (US); Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 379 days.

This patent is subject to a terminal disclaimer.

(21) Appl. No.: 12/356,056

(22) Filed: Jan. 19, 2009

(65) Prior Publication Data
US 2009/0130998 A1 May 21, 2009

Related U.S. Application Data

(63) Continuation of application No. 10/954,883, filed on Sep. 30, 2004, now Pat. No. 7,480,344.

(51) Int. Cl.
*H04L 25/49* (2006.01)
(52) U.S. Cl. ........ 375/297; 375/135; 375/295; 375/296; 375/299; 375/302; 455/116; 455/126
(58) Field of Classification Search .................. 375/147, 375/219, 220, 259, 261, 295, 296, 297, 299, 375/306, 316, 322, 342, 343, 349, 350, 135, 375/146, 260, 262, 267, 271, 302, 308, 351
See application file for complete search history.

(56) References Cited

U.S. PATENT DOCUMENTS

| | | | |
|---|---|---|---|
| 5,805,147 A * | 9/1998 | Tokioka et al. | 345/173 |
| 6,404,823 B1 * | 6/2002 | Grange et al. | 375/297 |
| 2002/0090921 A1 * | 7/2002 | Midtgaard et al. | 455/126 |
| 2003/0109233 A1 * | 6/2003 | Shi et al. | 455/116 |
| 2004/0219891 A1 * | 11/2004 | Hadjichristos | 455/102 |
| 2004/0220781 A1 * | 11/2004 | Hiratsuka et al. | 702/189 |
| 2005/0079835 A1 * | 4/2005 | Takabayashi et al. | 455/127.1 |
| 2005/0156662 A1 * | 7/2005 | Raghupathy et al. | 330/10 |

* cited by examiner

*Primary Examiner* — Hirdepal Singh
(74) *Attorney, Agent, or Firm* — Garlick & Markison

(57) ABSTRACT

In an envelope comparison embodiment, a delay calibrator produces a delay signal based on a comparison of a feedback signal and an envelope component of the transmitted signal. A down-converter produces the feedback signal from an outgoing modulated RF signal based on at least one local oscillation. Envelope detectors in the delay calibrator and the envelope signal path are operably coupled to a summing node that produces a delay error signal based on a temporal difference between the two envelopes. One embodiment includes phase detectors to detect and adjust the zero crossings of the feedback signal and the envelope signal path. As the delay mismatch between the envelope signal path and the phase signal path increases, the power spectrum increases in adjacent communication channels. A mask margin measurement technique measures the power level in an adjacent channel and adjusts the envelope path delay accordingly.

11 Claims, 13 Drawing Sheets

ARCHITECTURAL TECHNIQUES FOR ENVELOPE AND PHASE SIGNAL ALIGNMENT IN RF POLAR TRANSMITTERS USING POWER AMPLIFIER FEEDBACK

CROSS-REFERENCE TO RELATED APPLICATIONS

The present U.S. Utility Patent Application claims priority pursuant to 35 U.S.C. §120, as a continuation, to U.S. application Ser. No. 10/954,883, entitled "Architectural Techniques for Envelope and Phase Signal Alignment in RF Polar Transmitters using Power Amplifier Feedback,", filed Sep. 30, 2004, pending, which is hereby incorporated herein by reference in its entirety and made part of the present U.S. Utility Patent Application for all purposes.

BACKGROUND

1. Technical Field

The present invention relates to wireless communications and, more particularly, wideband wireless communication systems.

2. Related Art

Modern radio frequency (RF) transmitters for applications, such as cellular, personal, and satellite communications, employ digital modulation schemes, such as frequency shift keying (FSK) and phase shift keying (PSK), often in combination with Code Division Multiple Access (CDMA) communication. Some of these communication schemes, for example the 270.83 kbit/s binary Gaussian FSK employed in the Global System for Mobile Communications (GSM) cellular telephony standard, have constant envelopes. A constant-envelope modulation is an attractive solution for RF systems that allows using a nonlinear power amplifier (PA), thereby improving the efficiency of the system in the transmit mode. An example of such a system is the GSM/GPRS (General Packet Radio Service) standard that uses Gaussian Minimum Shift Keying (GMSK) modulation. In general, a constant-envelope modulation signal can be specified as:

$$s(t)=A\cos[\omega_c t+\phi(t)],$$

where $\phi(t)$ contains the information of the signal. Since the envelope of the signal is constant, the transmitter architecture is not limited to a Cartesian topology and hence a few other architectures have been introduced. Among these, a "translational loop" (also known as "offset phase lock loop (PLL)") is a popular architecture.

While constant-envelope systems allow nonlinear PAs and architectures such as translational loop, they do not make an efficient use of bandwidth. Therefore, to increase the data rate over a given bandwidth, other data-efficient modulations must be used. An example of such a system is the Enhanced Data rate GSM Evolution (EDGE) standard in which the data rate is three times as high as that of the GSM/GPRS standard while using the same bandwidth. In this case the modulated signal can be specified as $$s(t)=A(t)\cos[\omega_c t+\phi(t)].$$

In order to benefit the advantages of a nonlinear PA and a translational loop, a polar transmitter architecture is used. In this architecture, the phase and the envelope information are separated in the baseband. Then, the phase information, cos $[\omega_c t+\phi(t)]$, goes to a constant-envelope transmitter and the envelope of the signal, A(t), is used to modulate the PA by controlling the power of the PA. While this architecture seems to be a good solution, some practical issues limit the implementation. Among these, the delay mismatch between the phase and envelope is an important issue. Generally, delay through the phase path (translational loop) and the envelope path (mainly the power control of the PA) often are not the same effectively resulting in envelope and phase signals being slightly out of phase resulting in power spectral leakage in adjacent bands. These delay variations are partially the result of CMOS fabrication process variations, as well as temperature variations, that affect the analog circuitry of the signal paths slightly differently. In some prior works this mismatch is ignored, degrading the quality of the transmit signal. Ignoring delay mismatch in RF polar transmitters, however, is not an optimum solution.

The power spectrum emitted from an EDGE transmitter will not be ideal due to various imperfections in the RF transmitter circuitry that cause the delay mismatch as well as other problems. One quality measure of the EDGE standard that relates to the RF signal power spectrum is the so-called spectral mask requirement. This spectral mask represents the maximum allowable levels of the power spectrum as a function of frequency offset from the RF carrier in order for a given transmitter to qualify for EDGE certification. For example, at a frequency offset of 400 kHz (0.4 MHz), the maximum allowable emission level is −54 dB relative to the carrier (dBc).

Another RF transmitter quality measure of the EDGE standard is the modulation accuracy, which relates the RF transmitter modulation performance to an ideal reference signal. Modulation accuracy is stated in root-mean-square (RMS) and peak values and is specified in percentage format. For a given transmitter to qualify for EDGE certification, the RMS modulation error must be less than 9% and the peak modulation error must be less than 30%. Thus, to meet EDGE certification, a need exists to measure the frequency offset power spectrum and, if necessary, adjust the delay mismatch to reduce the frequency offset power spectrum.

There is a need, therefore, for a method and an apparatus that addresses the problems associated with delay mismatch while adhering to spectral mask requirements to improve performance of polar transmitters that are presently being designed.

SUMMARY OF THE INVENTION

An apparatus and a method of the present invention solve the delay mismatch problems using two techniques: envelope comparison and mask margin measurement. Several embodiments of a delay calibrator are presented to adjust a delay in an envelope path of an RF polar transmitter. In an envelope comparison embodiment, the delay calibrator produces a delay signal based on a comparison of a feedback signal and the envelope component of the transmitted signal. A down-converter produces the feedback signal from the outgoing modulated RF signal based on at least one local oscillation. Envelope detectors in the delay calibrator and the envelope signal path are operably coupled to a summing node that produces a delay error signal based on a difference between the two envelopes.

An alternate embodiment of the present invention includes phase detectors to detect the zero crossings of the feedback signal and the envelope signal path. A delay in the feedback signal path is adjusted to phase align the zero crossing of the feedback signal and the envelope signal path. Once the signals are phase aligned, the delay calibrator adjusts the envelope signal path delay to substantially reduce the delay mismatch between the envelope signal path and the phase signal path.

As the delay mismatch between the envelope signal path and the phase signal path increases, the power spectrum increases in adjacent communication channels. The EDGE requirement defines a spectral mask specification that defines a maximum power level, relative to a carrier signal, in the adjacent communication channels. The mask margin measurement technique measures the power level in the adjacent channel and adjusts the envelope signal path delay. A power meter measures an adjacent channel power at a specified offset from the carrier frequency and adjusts the delay through a delay block until the measured power is equal to or less than the specified value.

In one embodiment, band pass filtering comprising a low pass filter followed by a high pass filter is used to improve the dynamic of an analog-to-digital converter in the delay calibrator to substantially increase the sensitivity of the power measurements.

The above-referenced description of the summary of the invention captures some, but not all, of the various aspects of the present invention. The claims are directed to some of the various other embodiments of the subject matter towards which the present invention is directed. In addition, other aspects, advantages, and novel features of the invention will become apparent from the following detailed description of the invention when considered in conjunction with the accompanying drawings.

DETAILED DESCRIPTION OF THE DRAWINGS

Figure 1:
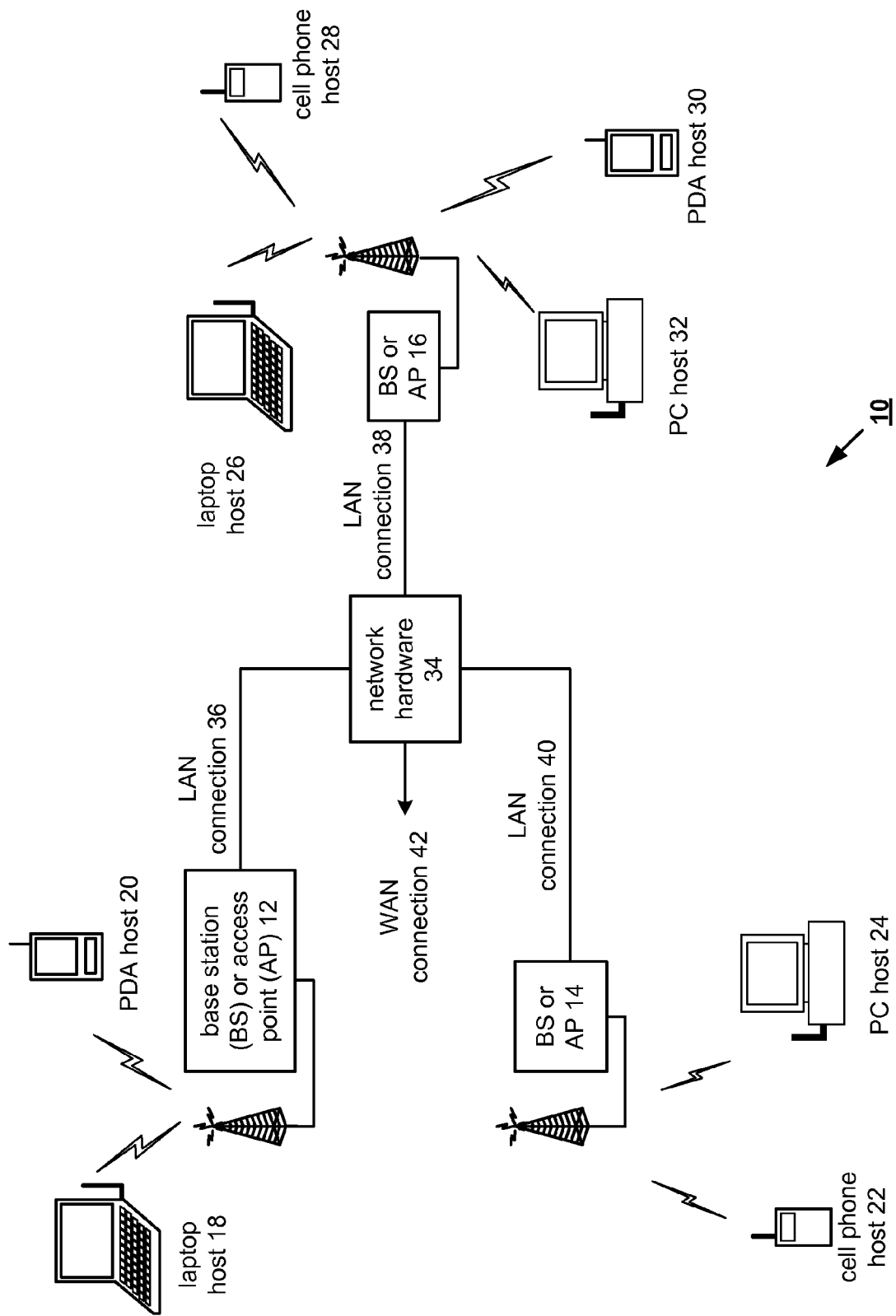
FIG. 1 is a functional block diagram illustrating a communication system that includes a plurality of base stations or access points (APs), a plurality of wireless communication devices, and a network hardware component.

A better understanding of the present invention can be obtained when the following detailed description of the preferred embodiment is considered with the following drawings, in which:

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32, and/or cellular telephone hosts 22 and 28. The details of the wireless communication devices will be described in greater detail with reference to FIG. 2.

The base stations or access points 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. Any of the hosts may include a digital modulator operable in one of a GSM, General Packet Radio Service (GPRS), and EDGE modulation modes. When operating a multi-mode modulator that switches between modulation modes, GMSK and 8-PSK for example, the present invention maintains the RF spectral power within the spectral mask requirements to limit spectral re-growth into adjacent channels.

Figure 2:
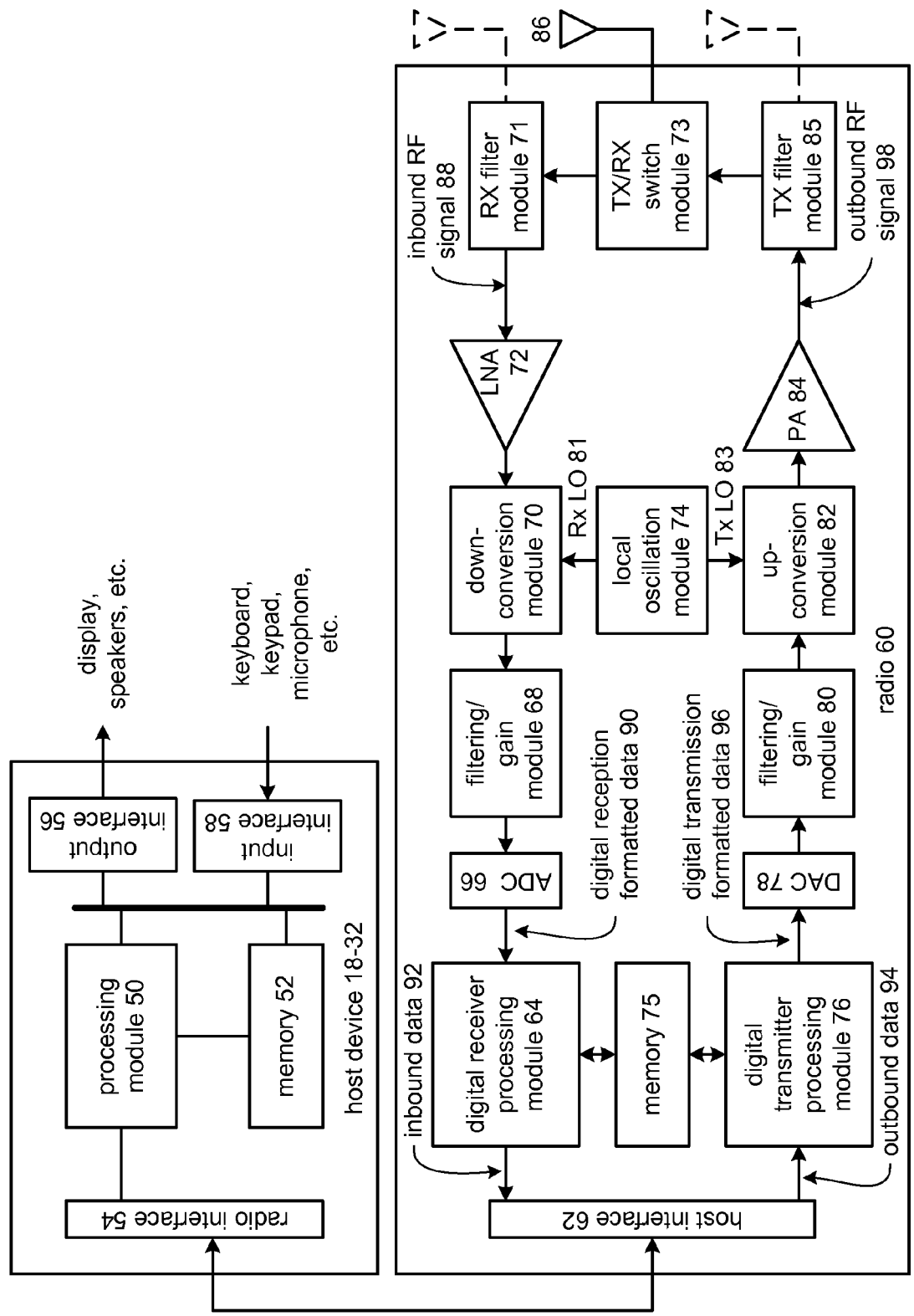
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device, such as a display, monitor, speakers, etc., such that the received data may be displayed. The radio interface 54 also provides data from the processing module 50 to the radio 60. The processing module 50 may receive the outbound data from an input device, such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (TX/RX) switch module 73, a local oscillation module 74, a memory 75, a digital transmitter processing module 76, a digital-to-analog converter 78, a filtering/gain module 80, an intermediate frequency (IF) mixing up-conversion module 82, a power amplifier (PA) 84, a transmitter filter module 85, and an antenna 86. The antenna 86 is shared by the transmit and receive paths as regulated by the TX/RX switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation. The digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., GSM, EDGE, IEEE 802.11a, IEEE 802.11b, Bluetooth, etc.) to produce digital transmission formatted data 96. The digital transmission formatted data 96 produced by a digital modulator of the present invention will be a digital baseband signal or a digital low IF signal, where the low IF typically will be in the frequency range of 100 KHz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. Local oscillation module 74 is, in one embodiment of the invention, a multi-stage mixer as described herein. The power amplifier 84 amplifies the RF signal to produce an outbound RF signal 98, which is filtered by the transmitter filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the TX/RX switch module 73, where the RX filter module 71 band pass filters the inbound RF signal 88. The RX filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. Local oscillation module 74 is, in one embodiment of the invention, a multi-stage mixer as described herein. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of host device 18-32 and the digital receiver processing module 64 and the digital transmitter processing module 76 of radio 60 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

Figure 3:
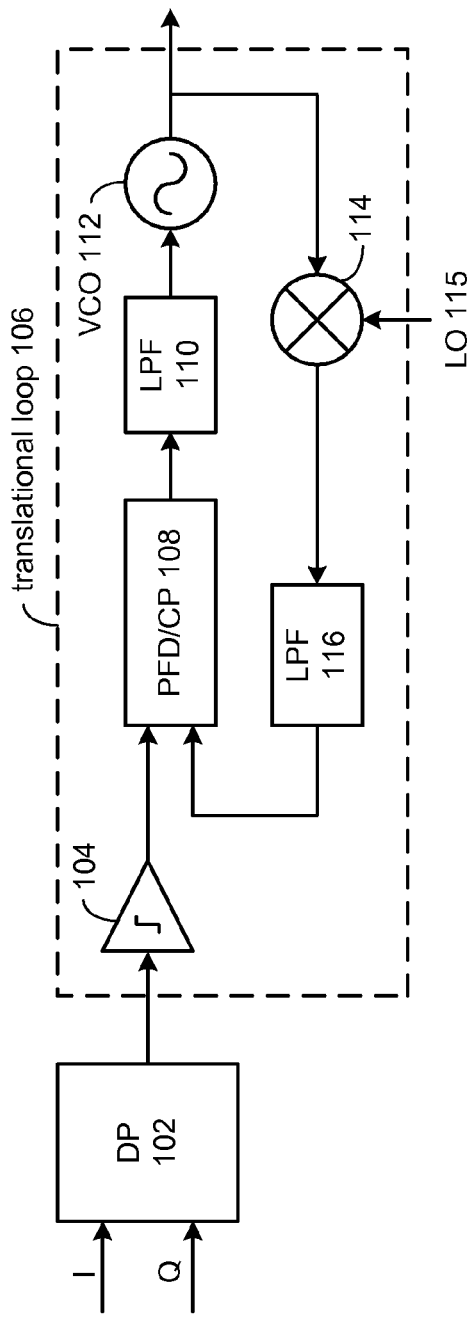
FIG. 3 is a schematic block diagram of a translational loop transmitter suitable for constant envelope modulation.

FIG. 3 is a schematic block diagram of a translational loop transmitter suitable for constant envelope modulation. Constant envelope modulation in RF systems allows the use of a nonlinear power amplifier (PA), thereby improving the efficiency of the system in the transmit mode. An example of such a system is the GSM/GPRS standard that uses GMSK modulation.

The in-phase signal (I) and the quadrature signal (Q) are operably coupled to digital processor 102 that produces a modulated baseband signal to translational loop 106. As is known to one of average skill in the art, the translational loop or offset phase lock loop (PLL) translates or up-converts an intermediate frequency signal to a radio frequency signal suitable for transmission. Translational loop 106 includes a pulse shaper 104, a phase frequency detector (PFD) and charge pump (CP) 108, low pass filters (LPF) 110 and 116, a voltage-controlled oscillator (VCO) 112, and a mixer 114. An external local oscillation (LO) 115 is operably coupled to translational loop 106. Operation of translation loop 106 is known to one of average skill in the art and will not be discussed further.

Figure 4:
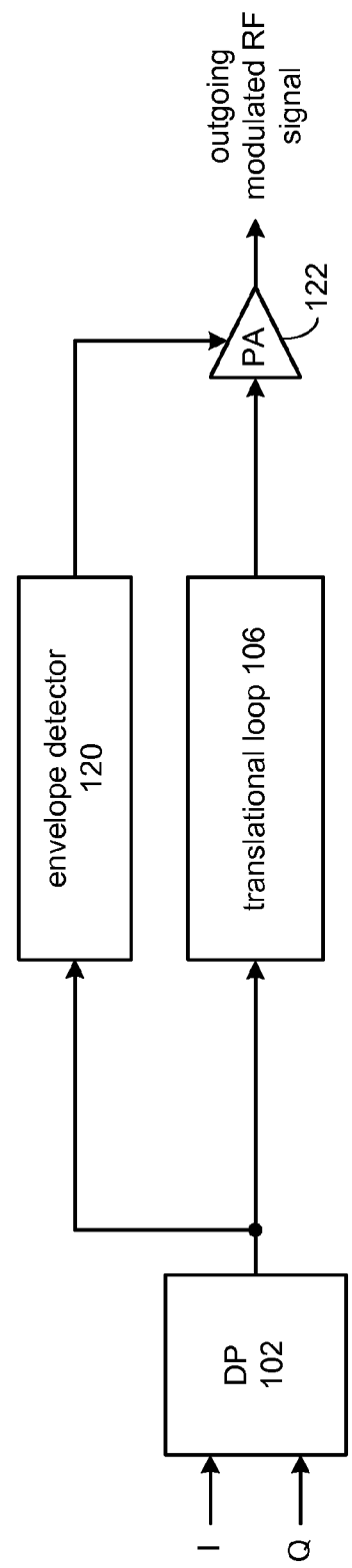
FIG. 4 is a schematic block diagram of a polar transmitter with an envelope detector.

FIG. 4 is a schematic block diagram of a polar transmitter with an envelope detector. The polar transmitter includes data processor (DP) 102, translational loop 106, an envelope detector 120, and a power amplifier (PA) 122. Translational loop 106 extracts the phase information from the signal produced by DP 102 and up-converts the IF signal to an RF signal. The envelope signal produced by envelope detector 120 modulates the phase signal in PA 122 to produce an outgoing modulated RF signal.

Figure 5:
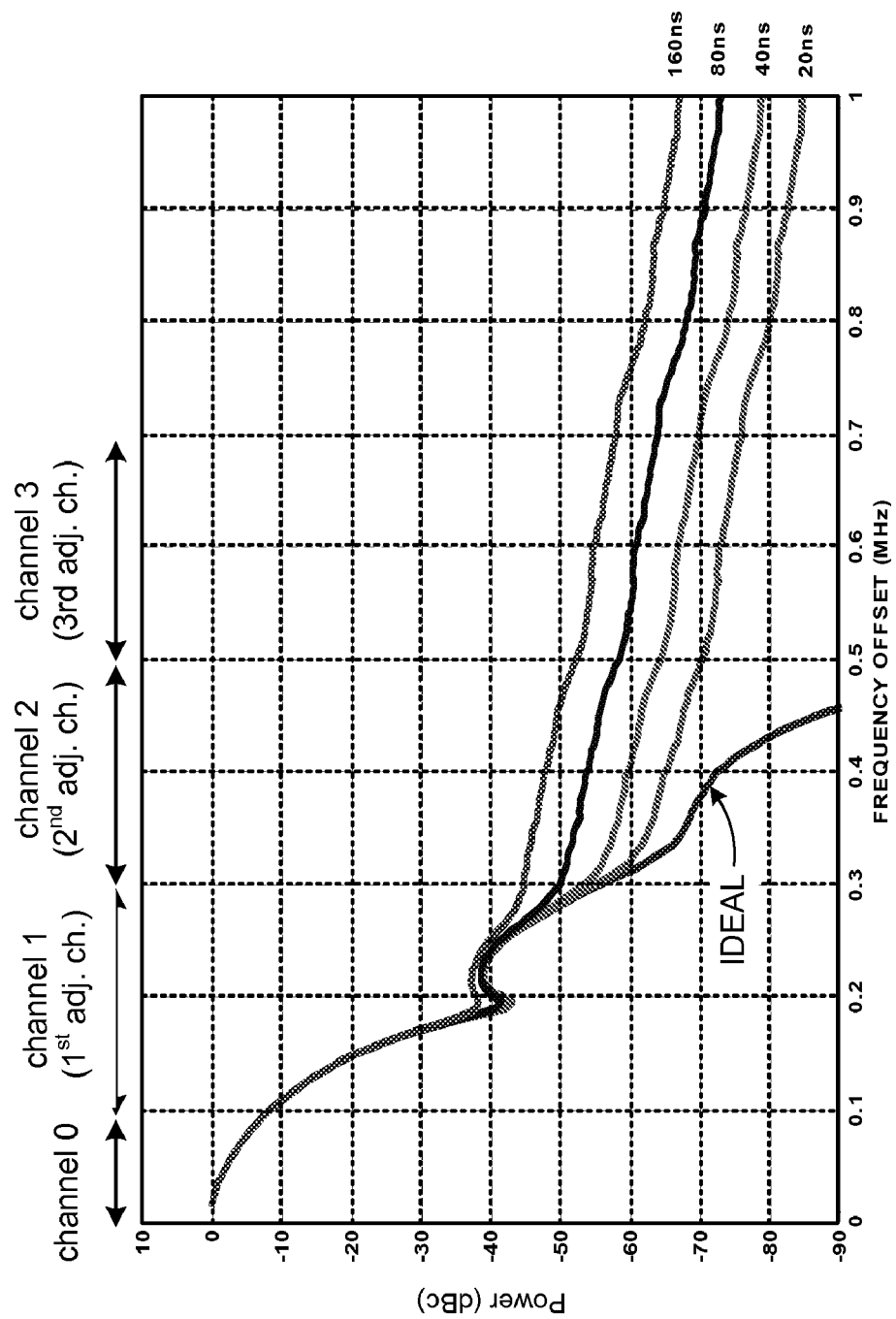
FIG. 5 illustrates several example RF signal output power spectra corresponding to an EDGE signal with various delay mismatches between the envelope and phase signal paths of the RF polar transmitter.

FIG. 5 is a diagram that shows several example RF signal output power spectra corresponding to an Enhanced Data rate GSM Evolution (EDGE) signal with various delay mismatches between the envelope and phase signal paths of the RF polar transmitter. FIG. 5 illustrates values of adjacent channel power due to delay mismatch for adjacent channels 1, 2 and 3 (first, second and third adjacent channels) for frequency offset values of 0 Hz to 1 MHz. As may be seen in FIG. 5, the significant impact of delay mismatch, for example with a delay mismatch of 80 nS or greater, is that the spectral mask requirement of −54 dBc at 400 kHz offset is not satisfied. As may be seen, adjacent channels to a channel carrying a primary signal experience a corresponding spectral power growth or influence from delay mismatch in the primary channel. Such adjacent channel power growth due to a primary channel delay mismatch may be evaluated in terms of an Adjacent Channel Power Ratio (ACPR). Such channel power growth is undesirable because design/standards-based spectral mask requirements may be violated. In order to restore the RF transmitter performance, delay mismatch must therefore be substantially canceled or reduced to reduce a value of ACPR if the ratio is calculated with the adjacent channel power in the numerator and the primary channel power in the denominator of the ratio. The delay mismatch may be reduced or canceled by introducing one of a positive or negative delay of a signal in one of the paths.

Figure 6:
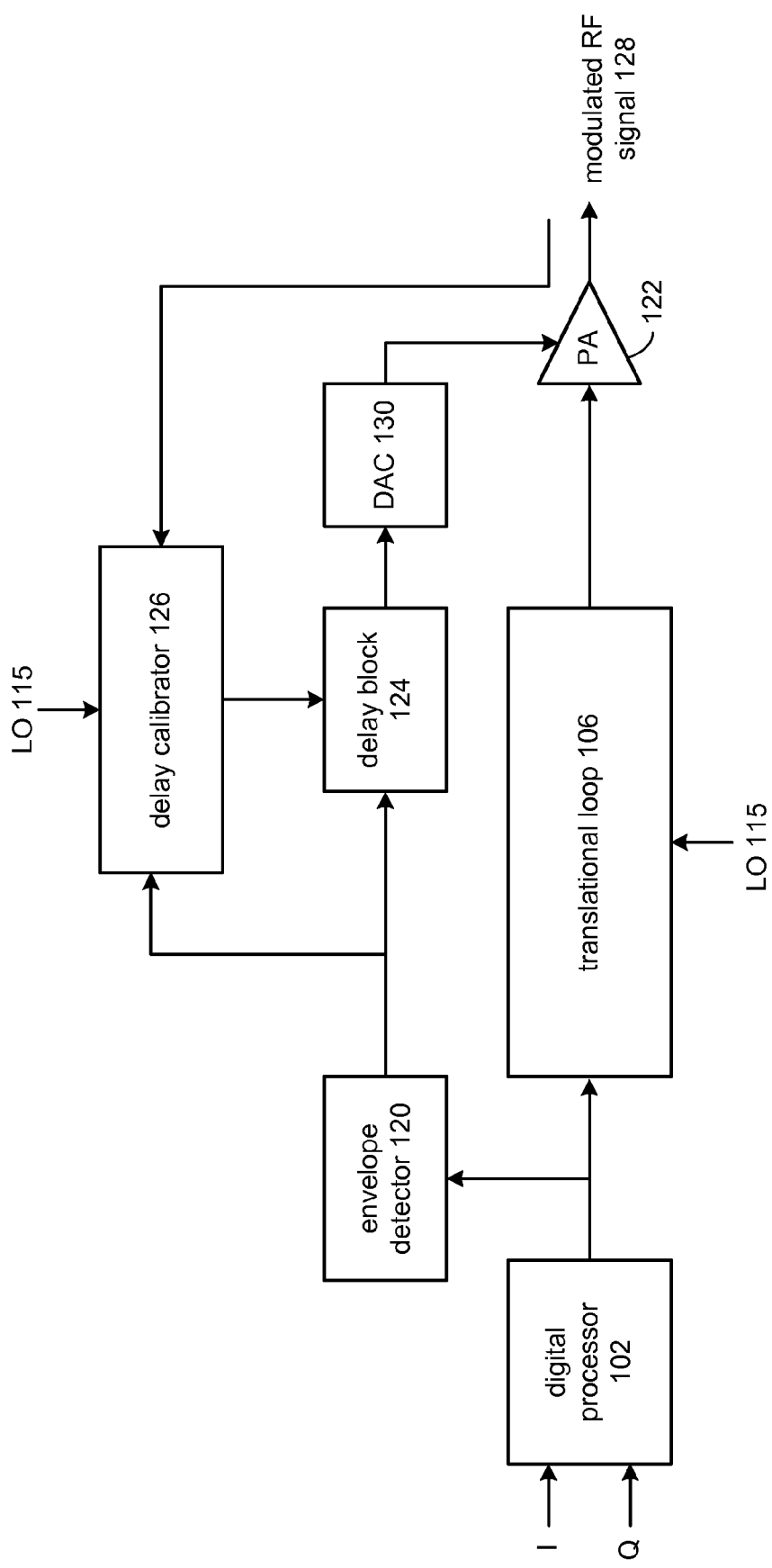
FIG. 6 is a schematic block diagram of a polar transmitter according to one embodiment of the present invention.

FIG. 6 is a schematic block diagram of a polar transmitter according to one embodiment of the present invention. In order to substantially cancel the delay mismatch between the phase signal path and the envelope signal path, a delay block 124 is operably coupled to receive the envelope signal from envelope detector 120. A delay value of delay block 124 is adjusted by a delay calibrator 126 based on a comparison of the envelope component produced from envelope detector 120 and outgoing modulated RF signal 128. Digital-to-analog converter (DAC) 130 converts the delayed envelope signal from a digital domain to an analog domain wherein the analog delayed envelope signal varies the power of power amplifier 122 to produce outgoing modulated RF signal 128.

A sample of modulated RF signal 128 is produced by an external coupler (not shown) to delay calibrator 126. Circuitry within delay calibrator 126 down-converts outgoing modulated RF signal 128 to produce a feedback signal that is compared to the envelope signal to produce the delay signal. The delay signal adjusts the delay through delay block 124 to substantially match the propagation delays in the phase path and envelope path. As is known to one of average skill in the art, substantially equal propagation delays in the envelope path and phase path have no effect on the modulation accuracy or spectral components of the outgoing RF signal, therefore the present invention seeks to substantially match the envelope path and phase path propagation delays.

Figure 7:
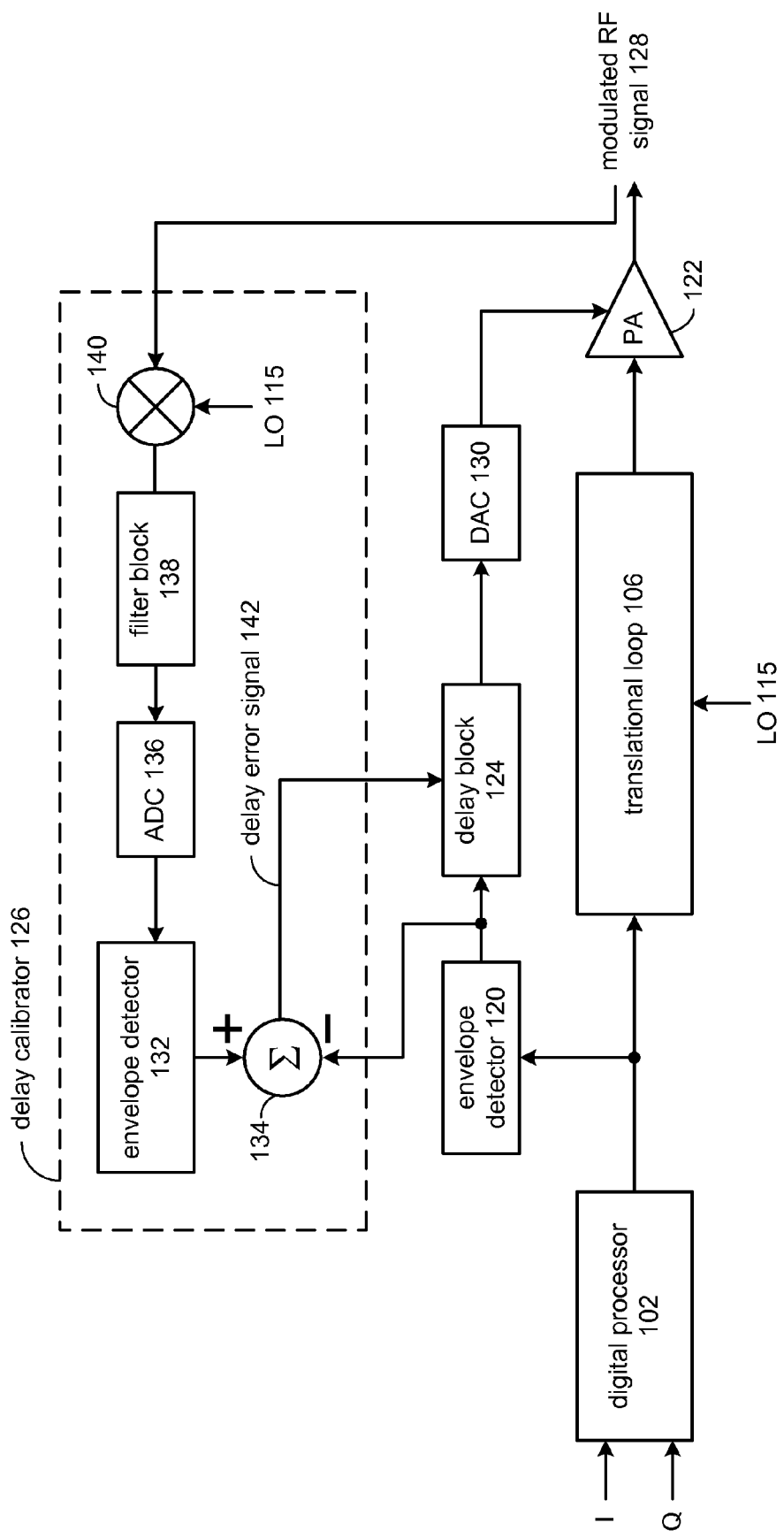
FIG. 7 is a schematic block diagram of a polar transmitter and delay calibrator according to one embodiment of the present invention.

FIG. 7 is a schematic block diagram of a polar transmitter and delay calibrator according to one embodiment of the present invention. As can be seen in FIG. 7, delay calibrator 126 includes an envelope detector 132, a summing node 134, an analog-to-digital converter (ADC) 136, a filtering block 138, and a down-converter 140. An external coupler (not shown) produces a sample of modulated RF signal 128 to down-converter 140 that produces a down-converted IF signal based on LO 115 and modulated RF signal 128. Filtering block 138 low pass filters the down-converted IF signal to produce a feedback signal to ADC 136. The filter of filtering block 138 may be implemented as one of a finite impulse response (FIR) filter or an infinite impulse response (IIR) filter, as is known to one of average skill in the art. The output of ADC 136 is operably coupled to envelope detector 132 which produces a feedback envelope signal. Summing node 134 produces a delay error signal 142 based on a difference in the feedback envelope signal produced by envelope detector 132 and the envelope signal produced by envelope detector 120. Delay error signal 142 operably coupled to delay block 124 changes the delay in the envelope signal path to substantially match the delay through the phase signal path.

Figure 8:
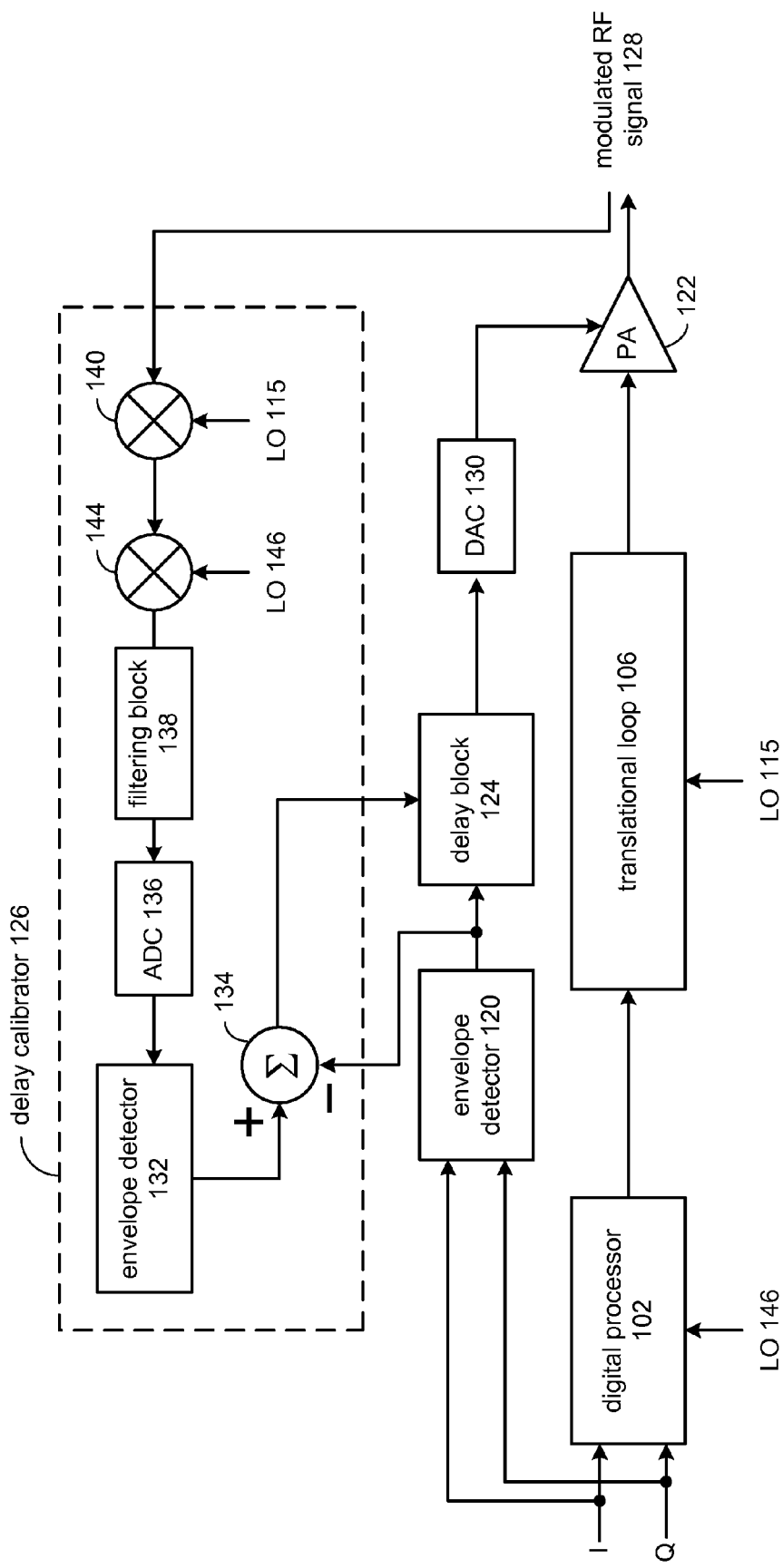
FIG. 8 is a schematic block diagram of a polar transmitter with delay calibrator according to an alternate embodiment of the present invention.

FIG. 8 is a schematic block diagram of a polar transmitter with delay calibrator according to an alternate embodiment of the present invention. As can be seen, the zero IF signal operably coupled to digital processor 102 is also operably coupled to envelope detector 120. The embodiment of FIG. 8 includes two down-converters, namely 140 and 144, operably coupled to receive local oscillations LO 115 and LO 146, respectively. The two down-converters receive the same local oscillations as digital processor 102 and translational loop 106, respectively, to produce a zero IF signal to filtering block 138. Thus, envelope detector 132 and envelope detector 120 produce envelope signals based on a zero IF signal. The operational details of the polar transmitter with the delay calibrator is functionally equivalent to FIG. 7.

Figure 9:
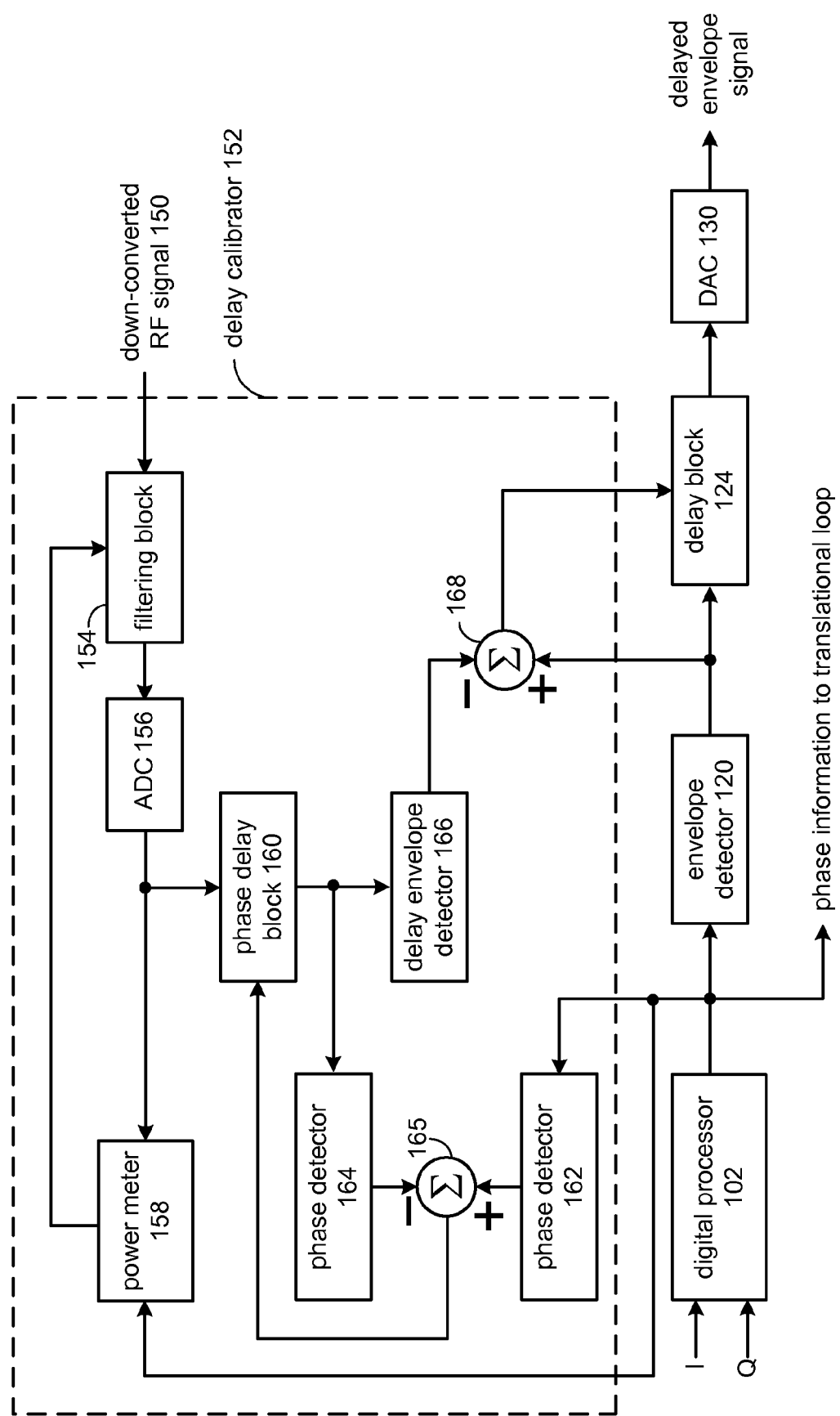
FIG. 9 is a schematic block diagram of a delay calibrator according to an alternate embodiment of the present invention.

FIG. 9 is a schematic block diagram of a delay calibrator according to an alternate embodiment of the present invention. In this embodiment of the present invention, a delay calibrator 152 adjusts the phase and the power level of down-converted RF signal 150 before adjusting the envelope delay. A power leveling loop, including a filtering block 154, an ADC 156, and a power meter 158, adjust the power of the filtered feedback signal produced from ADC 156 until the power level substantially matches the baseband power level produced from digital processor 102. Filtering block 154 filters down-converted RF signal 150 to produce a filtered feedback signal to ADC 156 that converts the filtered feedback signal from an analog signal to a digital signal. The output digital signal from ADC 156 represents a filtered feedback signal power level. Power meter 158 compares the digital processor IF signal produced by digital processor 102 and the filtered feedback signal power level from ADC 156 and produces a power feedback signal to filtering block 154 that adjusts the power level of the output of filtering block 154 until the two power levels are substantially equal.

Once the power levels are adjusted, the phase of the filtered feedback signal is adjusted so the zero crossing points of the filtered feedback signal and the IF signal are substantially equal. A phase detector 164 samples the zero crossing of the delayed feedback signal produced from a phase delay block 160. A phase detector 162 samples the zero crossing of the IF signal produced from digital processor 102. Summing node 165 compares the zero crossing times of the two signals and produces a phase component error signal. Phase delay block 160 receives the phase component error signal and adjusts a delay of phase delay block 160 until the zero crossings are substantially equal.

With the power levels and the zero crossings adjusted, delay calibrator 152 compares the envelopes of the IF signal and the delayed feedback signal to determine a delay value to substantially cancel the delay mismatch between the phase signal path and the envelope signal path. A delay envelope detector 166 produces a delayed envelope signal to a summing node 168 while envelope detector 120 produces an IF signal envelope to summing node 168. The delay signal produced by summing node 168 is operably coupled to delay block 124 wherein the delay through delay block 124 is adjusted to substantially cancel the delay mismatch between the phase signal path and the envelope signal path.

Figure 10:
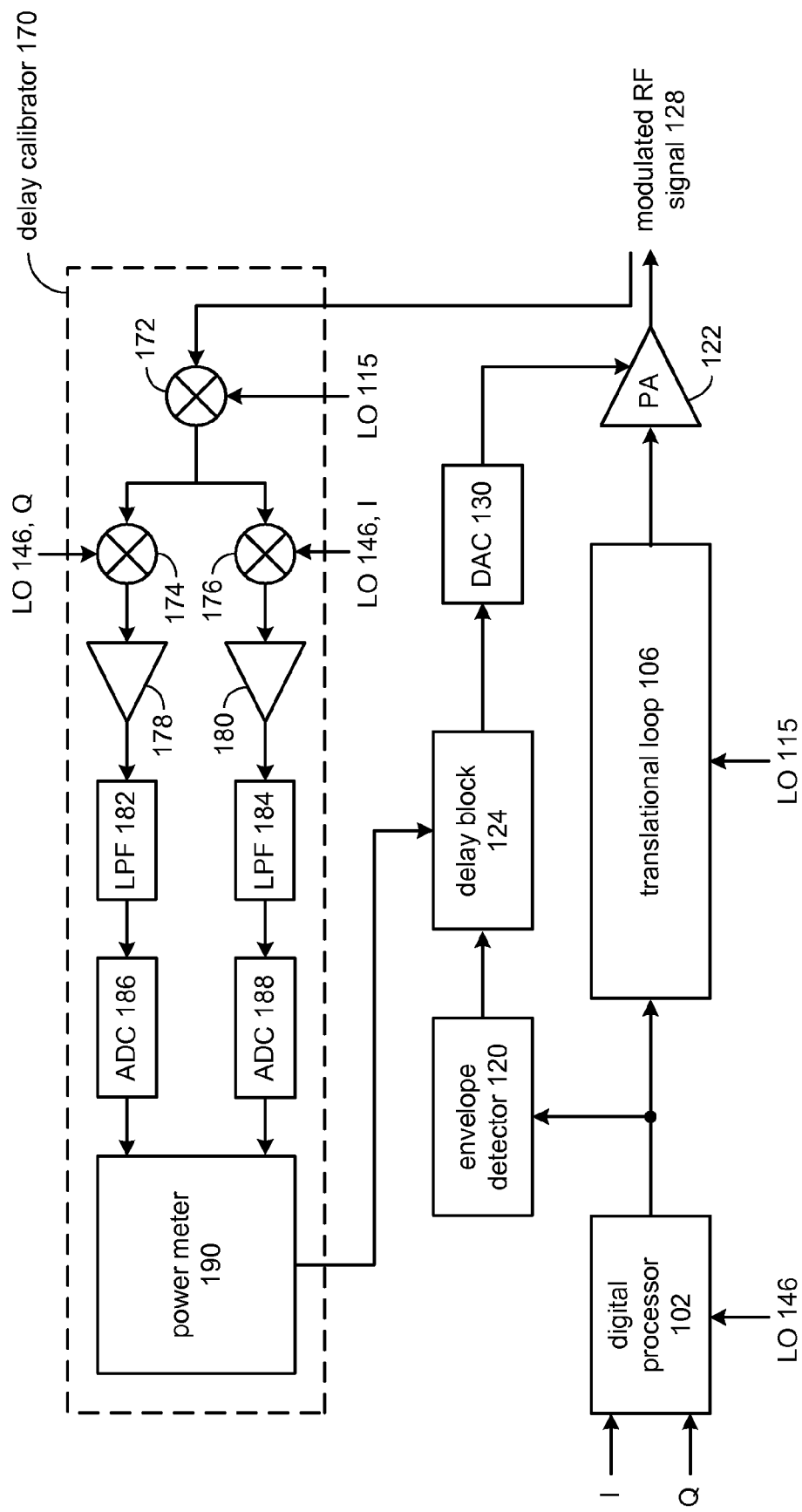
FIG. 10 is a schematic block diagram of a mask margin measurement embodiment of the present invention.

FIG. 10 is a schematic block diagram of a mask margin measurement embodiment of the present invention. As stated previously, delay mismatch between the phase signal path and the envelope signal path increases the spectral re-growth in adjacent channels. A delay calibrator 170 measures the power level at a specified frequency offset from modulated RF signal 128 and based on a specification of the EDGE spectral mask, adjusts the envelope signal path delay to lower the spectral re-growth at the specified frequency offset.

Delay calibrator 170 includes down-converters 172, 174, and 176, baseband amplifiers 178 and 180, LPFs 182 and 184, ADCs 186 and 188, and a power meter 190. The outgoing modulated RF signal 128 is operably coupled to down-converter 172 where it is mixed with LO 115 to produce an IF signal. Down-converters 174 and 176 receive the I and Q components of LO 146, respectively, to produce in-phase and quadrature feedback signals at substantially a zero IF. Baseband amplifiers 178 and 180 amplify the feedback signals as necessary then operably couple the feedback signal to LPF 182 and 184, respectively, which remove any high frequency components of the feedback signal.

ADCs 186 and 188 convert the in-phase and quadrature feedback signals, respectively, from an analog domain to a digital domain to produce a digital feedback signal. Power meter 190 measures a power level in an adjacent channel to the digital feedback signal. The power level in the adjacent channel is a function of the delay mismatch. Power meter 190 produces a delay signal to delay block 124 to substantially reduce the delay mismatch between the phase signal path and the envelope signal path.

Figure 11:
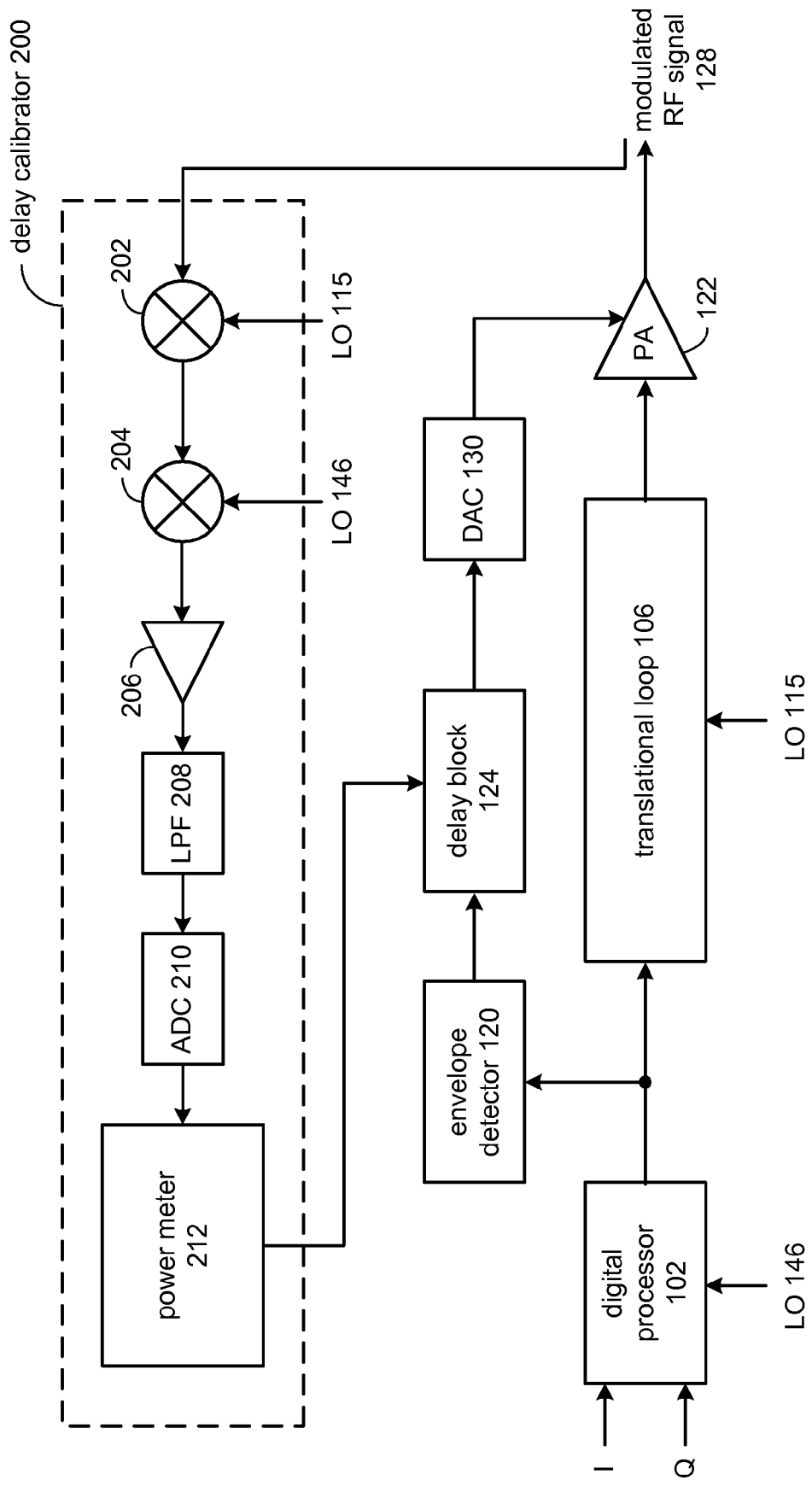
FIG. 11 a schematic block diagram of a mask margin measurement embodiment of the present invention.

FIG. 11 a schematic block diagram of a mask margin measurement embodiment of the present invention. A delay calibrator 200 includes down-converters 202 and 204, baseband amplifier 206, a LPF 208, an ADC 210, and a power meter 212. The outgoing modulated RF signal 128 is operably coupled to down-converter 202 where it is mixed with LO 115 to produce an IF signal. Down-converter 204 receives LO 146 and the IF signal from down-converter 202 to produce a feedback signal at substantially a zero IF. Baseband amplifier 206 amplifies the feedback signal as necessary then operably couples the feedback signal to LPF 208 to remove any high frequency components of the feedback signal.

ADC 210 converts the feedback signal from an analog domain to a digital domain to produce a digital feedback signal. Power meter 212 measures a power level in an adjacent channel to the digital feedback signal. The power level in the adjacent channel is a function of the delay mismatch. Power meter 212 produces a delay signal to delay block 124 to substantially reduce the delay mismatch between the phase signal path and the envelope signal path.

Figure 12:
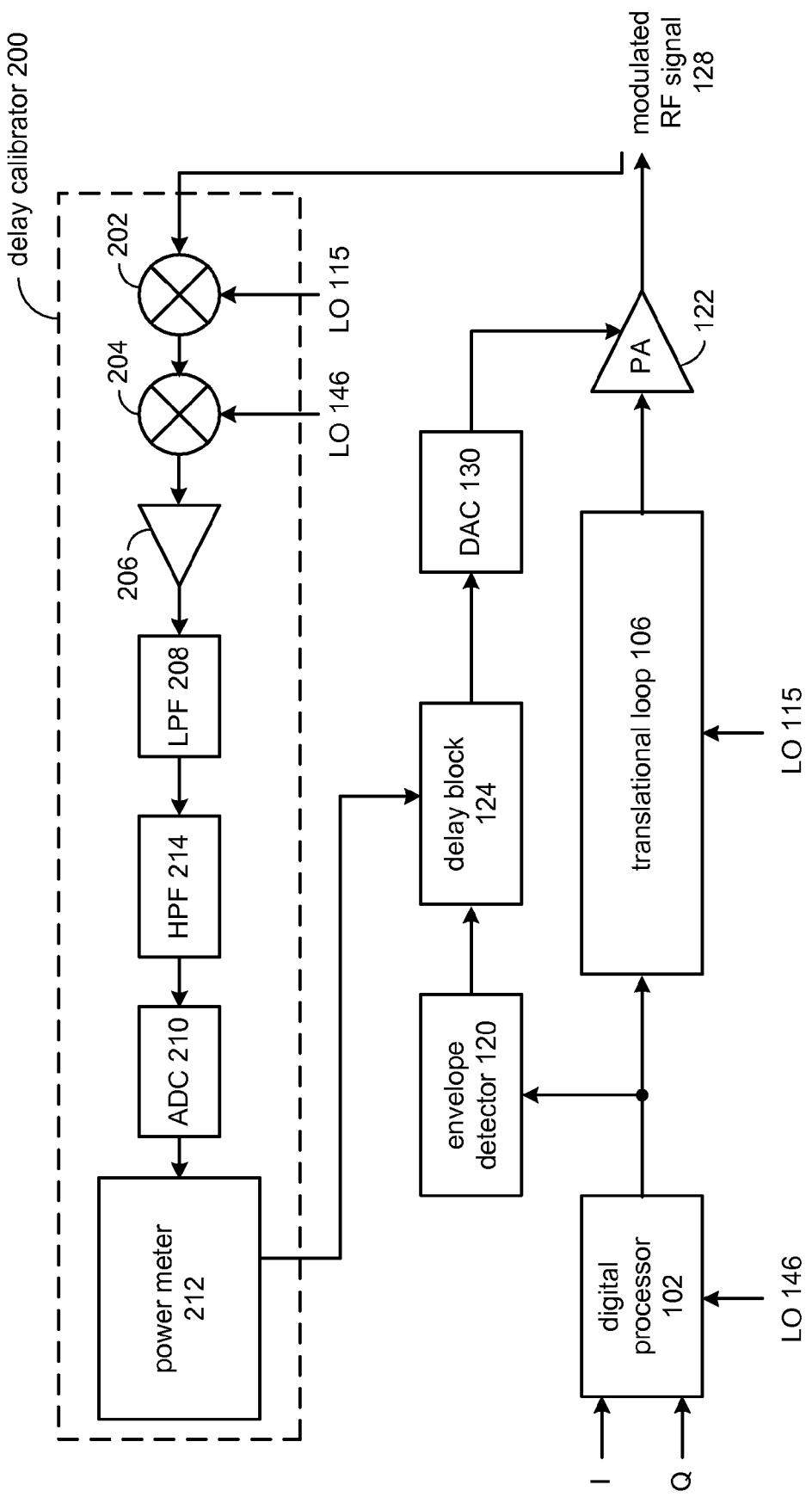
FIG. 12 is schematic block diagram of a mask margin measurement embodiment of the present invention.
Figure 13:
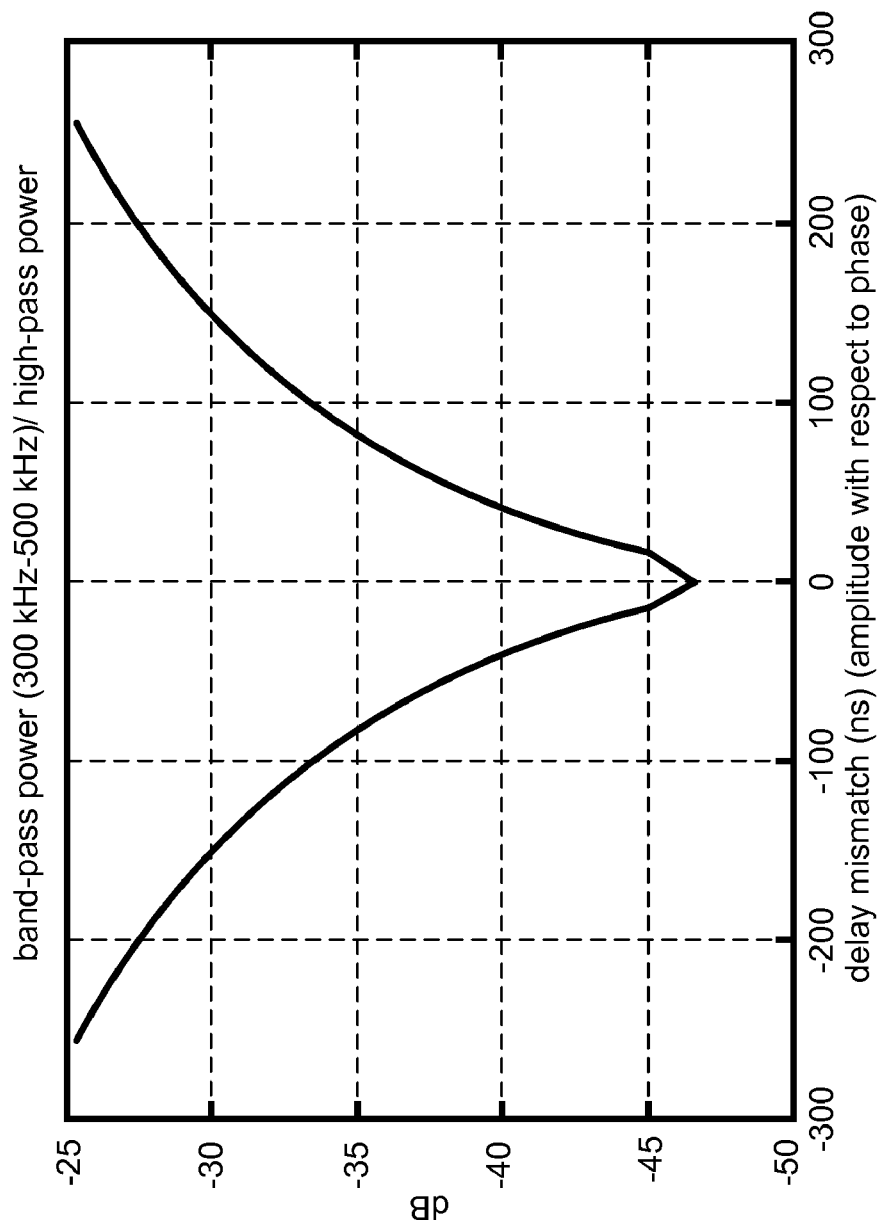
FIG. 13 is a graph illustrating band-pass power with respect to delay mismatch.

FIG. 12 is schematic block diagram of a mask margin measurement embodiment of the present invention. FIG. 12 is a functional equivalent to FIG. 11 and includes a high pass filter (HPF) 214 to improve the dynamic range of ADC 210. As can be seen in a graph of delay mismatch with respect to phase as is shown in FIG. 13, the band pass power in the adjacent channel frequency of 300 kHz to 500 kHz is less than −50 dB. The dynamic range of ADC 210 can be relaxed by band pass filtering (low pass filter followed by a high pass filter) which reduces the quantization error of ADC 210. The functional details of FIG. 12 are as described with respect to FIG. 11.

FIG. 13 is a graph illustrating band pass power with respect to delay mismatch. As can be seen, the band pass power relative to the high pass power is less than −50 dB with zero mismatch. Over the range of +/−300 ns the relative power change is approximately 25 dB so the dynamic range of the ADC can be greatly relaxed by the use of a band pass filter in the delay calibrator.

Figure 14:
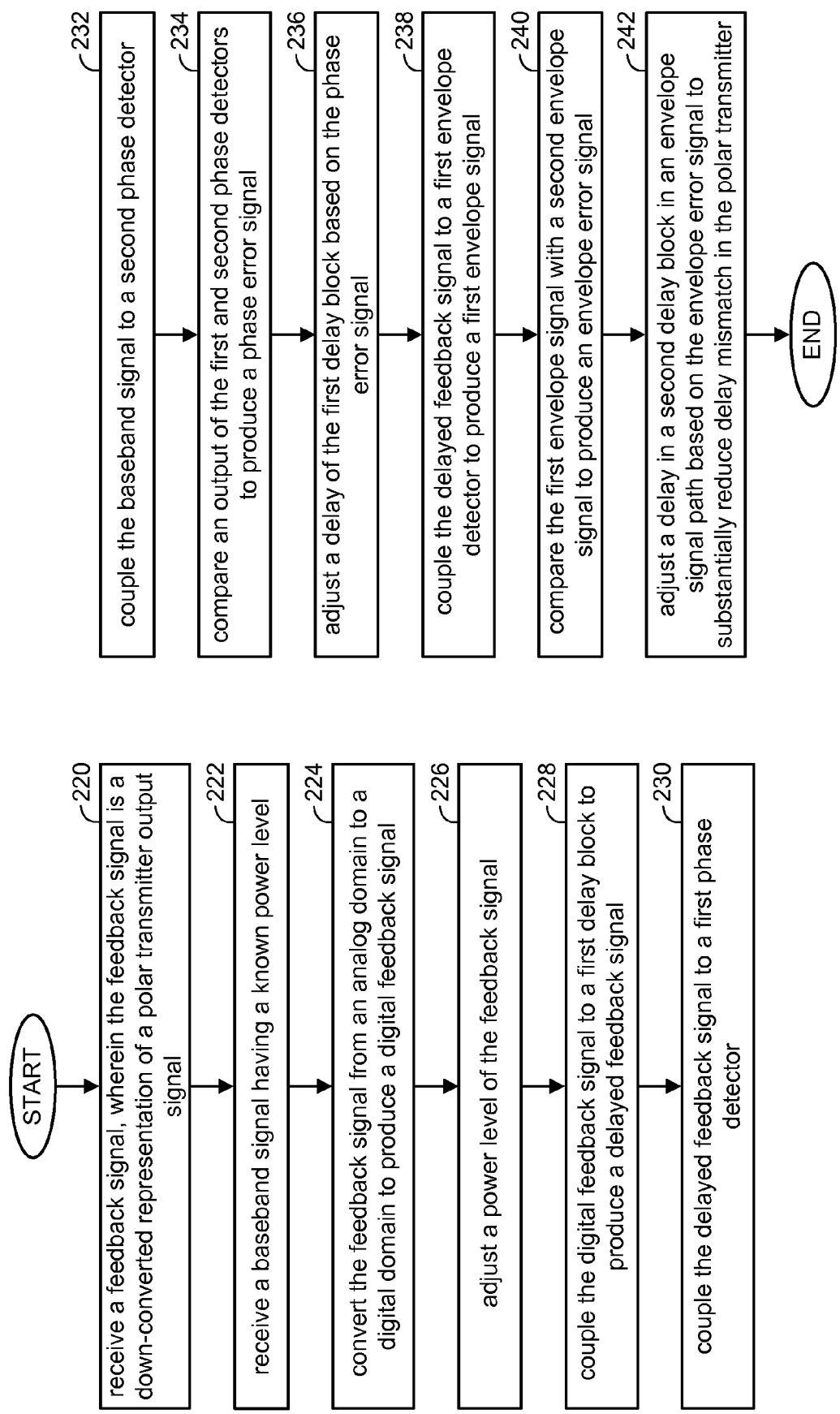
FIG. 14 is a flow chart for a method in accordance with an embodiment of the present invention.

FIG. 14 is a flow chart for a method in accordance with an embodiment of the present invention. The method includes a delay calibrator for reducing delay mismatch between a phase signal path and an envelope signal path in an RF polar transmitter. The polar transmitter output signal is an RF signal comprising a phase signal modulated by an envelope signal. A timing mismatch in the phase signal path relative to the envelope signal path leads to spectral re-growth in adjacent communication channels, as is known to one of average skill in the art. In order to substantially reduce the spectral re-growth, the delay calibrator adjusts the delay in one of the envelope signal path or the phase signal path.

The method includes the delay calibrator that receives a feedback signal, wherein the feedback signal is a down-converted representation of a polar transmitter output signal (step 220). A power meter in the delay calibrator receives a baseband signal having a known power level (step 222). Thereafter, an ADC converts the feedback signal from an analog domain to a digital domain to produce a digital feedback signal (step 224). The power meter compares the baseband signal to the digital feedback signal then adjusts a power level of the feedback signal (step 226) such that the feedback signal power level is substantially equal to the baseband signal power level.

The delay calibrator couples the digital feedback signal to a first delay block to produce a delayed feedback signal (step 228) then couples the delayed feedback signal to a first phase detector (step 230). Additional steps include coupling the baseband signal to a second phase detector (step 232). The first and second phase detectors are used to phase align the digital feedback signal and the baseband signal. Stated differently, the delay calibrator compares an output of the first and second phase detectors to produce a phase error signal (step 234). The method compares the outputs of the first and second phase detectors by coupling the delayed feedback signal to the first phase detector to produce a first zero crossing signal and by coupling the baseband signal to the second phase detector to produce a second zero crossing signal. A summing node in the delay calibrator subtracts the first zero crossing signal from the second zero crossing signal to produce the phase (component?) error signal. The phase (component?) error signal corresponds to a temporal difference between the first and second zero crossing signals. Thereafter, the delay calibrator adjusts a delay of the first delay block based on the phase error signal (step 236). At this point the zero crossings and the power levels of the two signals are substantially equal. This allows more accurate delay adjustments between the phase signal path and the envelope signal path. To adjust the delay, the delay calibrator couples the delayed feedback signal to a first envelope detector to produce a first envelope signal (step 238). A summing node compares the first envelope signal with a second envelope signal to produce an envelope error signal (step 240) that represents a timing delay between the phase signal path and the envelope signal path. The output from the summing node adjusts a delay in a second delay block in the envelope signal path based on the envelope error signal to substantially reduce delay mismatch in the polar transmitter (step 242).

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents, and alternatives falling within the spirit and scope of the present invention as defined by the claims.

What is claimed is:

1. A polar transmitter comprising:
   a digital processor operable to produce an outgoing modulated signal;
   a translational loop operable to produce an outgoing modulated Radio Frequency (RF) signal based upon the outgoing modulated signal;
   a power amplifier operable to produce an amplified outgoing modulated RF signal based upon the outgoing modulated RF signal and an amplifier input;
   a polar transmitter envelope signal path comprising:
      an envelope detector operable to produce an envelope signal based upon the outgoing modulated signal; and
      a delay block operable to produce the amplifier input based upon the envelope signal and a delay error signal;
   a delay calibrator comprising:
      a down-converter operable to produce a feedback signal based upon the amplified outgoing modulated RF signal;
      a filter block operable to filter the feedback signal;
      a delay calibrator envelope detector operable to produce a feedback envelope signal based on the filtered feedback signal; and
      summing node operable to produce the delay error signal based on a difference between the feedback envelope signal and the envelope signal.

2. The polar transmitter of claim 1, wherein the polar transmitter envelope signal path further comprises a Digital to Analog Converter (DAC) operable to convert the amplifier input from a digital signal to an analog signal.

3. The polar transmitter of claim 1, wherein the delay calibrator further comprises a power meter operable to adjust the feedback envelope signal power to match the envelope signal power.

4. The polar transmitter of claim 1, wherein the outgoing modulated signal comprises a digital intermediate frequency (IF) signal.

5. An RF transmitter, comprising:
   a digital processor operable to produce an outgoing modulated signal;
   a translational loop operable to produce an outgoing modulated Radio Frequency (RF) signal based upon the outgoing modulated signal;
   a power amplifier operable to produce an amplified outgoing modulated RF signal based upon the outgoing modulated RF signal and an amplifier input;
   a polar transmitter envelope signal path comprising:
      an envelope detector operable to produce an envelope signal based upon the outgoing modulated signal; and
      a delay block operable to produce the amplifier input based upon the envelope signal and a delay error signal;
   a delay calibrator comprising:
      a down-converter operable to produce a feedback signal based upon the amplified outgoing modulated RF signal;
      first and second phase detectors operable to detect zero crossings of the outgoing modulated signal and the feedback signal, respectively; and
      first summing node operable to produce a phase component error signal based on a difference between the zero crossing of the feedback signal and the zero crossing of the outgoing modulated signal;
      a phase delay block operable to delay the zero crossing of the feedback signal, based upon the phase component error signal, to substantially align the zero crossing of the feedback signal with the zero crossing of the outgoing modulated signal; and
      second summing node operable to produce the delay error signal based upon a difference between the envelope signal and an envelope of the feedback signal after zero crossing alignment.

6. The RF transmitter of claim 5, wherein the polar transmitter envelope signal path further comprises a Digital to Analog Converter (DAC) operable to convert the amplifier input from a digital signal to an analog signal.

7. The RF transmitter of claim 5, wherein the outgoing modulated signal comprises a digital intermediate frequency (IF) signal.

8. A method for operating a polar transmitter comprising:
producing an outgoing modulated signal;
producing an outgoing modulated Radio Frequency (RF) signal based upon the outgoing modulated signal;
producing an amplified outgoing modulated RF signal based upon the outgoing modulated RF signal and an amplifier input;
producing an envelope signal based upon the outgoing modulated signal;
producing the amplifier input based upon the envelope signal and a delay error signal;
producing a feedback signal based upon the amplified outgoing modulated RF signal;
filtering the feedback signal;
producing a feedback envelope signal based on the filtered feedback signal; and
producing the delay error signal based on a difference between the feedback envelope signal and the envelope signal.

9. The method of claim 8, further comprising converting the amplifier input from a digital signal to an analog signal.

10. The method of claim 8, further comprising adjusting the feedback envelope signal power to match the envelope signal power.

11. The method of claim 8, wherein the outgoing modulated signal comprises a digital intermediate frequency (IF) signal.

* * * * *